United States Patent [19]

Platt

[11] Patent Number: 4,877,978

[45] Date of Patent: Oct. 31, 1989

[54] OUTPUT BUFFER TRI-STATE NOISE REDUCTION CIRCUIT

[75] Inventor: Paul E. Platt, Starkville, Miss.

[73] Assignee: Cypress Semiconductor, San Jose, Calif.

[21] Appl. No.: 246,634

[22] Filed: Sep. 19, 1988

[51] Int. Cl.[4] .................. H03K 19/017; H03K 19/096; H03K 17/04; H03K 17/687

[52] U.S. Cl. .................................... 307/473; 307/452; 307/555; 307/568; 307/585

[58] Field of Search ............................... 307/450–453, 307/475, 481, 571, 572, 577, 579, 581, 583, 584, 585, 591, 594, 605, 270, 279, 558, 555, 568

[56] References Cited

U.S. PATENT DOCUMENTS

| | | | |
|---|---|---|---|
| 3,737,673 | 5/1973 | Suzuki | 307/452 |
| 3,973,139 | 8/1976 | Dingwall | 307/452 X |
| 4,217,502 | 8/1980 | Suzuki et al. | 307/473 |
| 4,329,600 | 5/1982 | Stewart | 307/473 X |
| 4,585,958 | 4/1986 | Chung et al. | 307/473 |
| 4,678,943 | 7/1987 | Uragami et al. | 307/473 |
| 4,723,108 | 2/1988 | Murphy et al. | 307/304 X |

Primary Examiner—Stanley D. Miller
Assistant Examiner—David R. Bertelson

[57] ABSTRACT

The invention pertains to an output buffer circuit capable of switching from the off state to the on state, and from the on state to the off state, without generating significant noise. The circuit includes an MOS inverter circuit having a first node adapted to be connected to one terminal of a power supply and a second node adapted to be connected to the other node, and having an input for receiving an input signal and an output for providing an output signal adapted to be connected to an output transistor. The circuit also has a first MOS transistor of one polarity type and one mode having its source-drain circuit coupled in series with the first node of the inverter circuit, and a second MOS transistor opposite in either polarity type or mode from the first MOS transistor, having its source-drain circuit coupled in series with the other node of the inverter circuit. A first reference voltage is supplied to the gate of the first MOS transistor and a second mirrored reference voltage is supplied to the gate of the second MOS transistor. These reference voltages are capable of generating a stable current over normal variations in operating and processing conditions, whereby the rise and fall times of the output signal from the inverter circuit are precisely controlled, irrespective of normal changes in operating or processing conditions of the MOS transistor in the circuit, thereby reducing noise when the output transistor connected to the output is turned on or off.

6 Claims, 2 Drawing Sheets

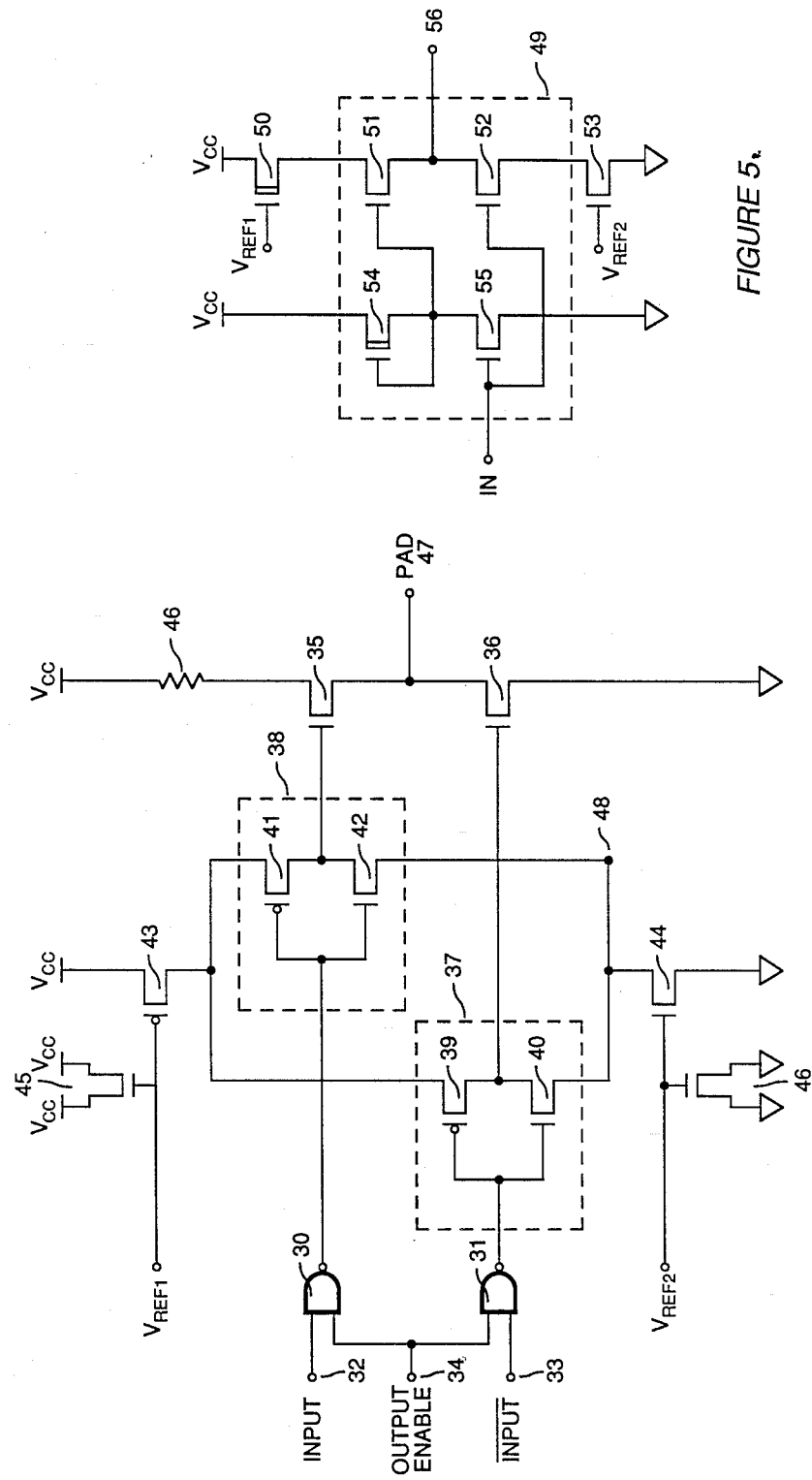

OUTPUT BUFFER TRI-STATE NOISE REDUCTION CIRCUIT

BACKGROUND AND PRIOR ART

In MOS transistor circuitry, particularly in CMOS technology, it is commonly necessary to couple the output signals from sense amplifiers to an output pin of the integrated circuit. Sense amplifiers are used, for example, to sense binary output signals from random access memories (RAMs), or product terms from the term lines of programmable logic devices (PLDs). Such circuitry often uses a tri-state output which not only can be high or low, providing a binary 1 or a 0, but can also be placed in the "off" state where the output is "floating". These circuits often employ output enable circuitry which is capable of totally disabling (turning off) the tri-state output.

In the past, attention has been paid to reduction of turn-on noise in such tri-state output circuits, such noise resulting from turning the output from "off" to "on". For example, U.S. Pat. No. 4,723,108, assigned to the same assignee as the subject invention, discloses the use of a reference input voltage supply to drive a pull-down transistor which pulls the output pad down to ground at appropriate times. As shown in FIG. 1, labeled "Prior Art", this reference input voltage at node 6 is used to reduce noise on the output signal pad at node 1 when transistor M19 turns on. The reference input voltage at node 6 of this prior art circuit, connected to the gate of transistor M15, produces a current which controls the rising edge of the voltage at node 2 connected to the gate of transistor M19, which in turn drives the output of transistor M19 down to ground at appropriate times, such as, for example, when the output signal should be "0" in case of a positive logic signal. This current into its gate controls the switching time of transistor M19 by controlling the rate of change, di/dt, of its source-drain current.

It is conventional wisdom that the principal noise problem observed in tri-state circuits of this type occurs during changes in the tri-state output device from no current to high current (when the output transistor is switched from off to on). Accordingly, no one has considered noise which may occur when the output transistor is switched from high current to low current (on to off). However, certain failures began to occur in circuits of this type resulting in spurious output data, and no one knew what the source of the problem was. Unexpectedly, it was found, again referring to the circuit of FIG. 1 of the prior art, that the voltage on the source of transistor M19 connected to $V_{ss}$ tended to fall relative to the ground voltage on the external PC board as a result of noise in the circuit. Surprisingly, this decrease in voltage occurred when node 2 was being switched from high to low (on to off), and often resulted in a failure condition of the circuit which prevented the correct detection of a data signal input. This failure mode was not understood.

An unexpected solution to this problem was found. It was discovered that one could use two reference voltage sources, one which is the mirror of the other, one of which is coupled to the gate of a transistor coupled to the positive rail and the other coupled to the gate of a second transistor coupled to the negative rail. Using these two reference voltages, it was discovered that it is possible not only to reduce output noise when the output transistor turns on, but also to reduce output noise when the transistor turns off. In addition, the circuit of the invention, contrary to that of the prior art shown in FIG. 1, is capable not only of controlling the switching of pull-down transistor M19, but also the switching of pull-up transistor M18, the noise on both of these switching transistors being controlled, as in the prior art, when they switch from off to on, and also when they switch from on to off.

BRIEF DESCRIPTION OF THE INVENTION

Briefly, this invention provides an output buffer circuit capable of switching from the off state to the on state, and from the on state to the off state, without generating significant noise. The circuit includes an MOS inverter circuit having a first node adapted to be connected to one terminal, such as the positive terminal, of a power supply, and a second node adapted to be connected to the other node, such as the negative node of the power supply. The inverter circuit has an input node for receiving an input signal and an output node for providing an output signal adapted to be connected to an output transistor.

Two transistors are used to couple the MOS inverter circuit to the power supply. A first MOS transistor of one polarity type and one mode, for example, a p-channel enhancement mode transistor, has its source-drain circuit series-coupled between the first node of the MOS inverter circuit and the positive power supply terminal. A second MOS transistor opposite in either polarity type or mode from the first MOS transistor, such as an n-channel enhancement mode transistor, has its source-drain circuit coupled in series between the other node of the MOS inverter circuit and the negative or ground terminal.

A reference voltage supply is coupled to the gate of the first MOS transistor to supply a reference voltage to that transistor, and is indirectly coupled through a current mirror circuit to the gate of the second MOS transistor to supply a second mirrored reference voltage to that transistor. These reference voltages are capable of generating a stable current over normal variations in operating and processing conditions of the MOS transistors, thereby reducing noise when an output transistor connected to the output of the inverter is turned on or off.

Contrary to the circuits of the prior art, the circuit of the invention is capable of controlling noise during all operating transitions, both from off to on and on to off.

DESCRIPTION OF THE DRAWINGS

FIG. 4 is a circuit schematic diagram of a preferred embodiment of the invention; and FIG. 5 is a circuit schematic of yet another embodiment of the invention which uses a combination of enhancement and depletion devices.

DETAILED DESCRIPTION OF THE INVENTION

Figure 2:
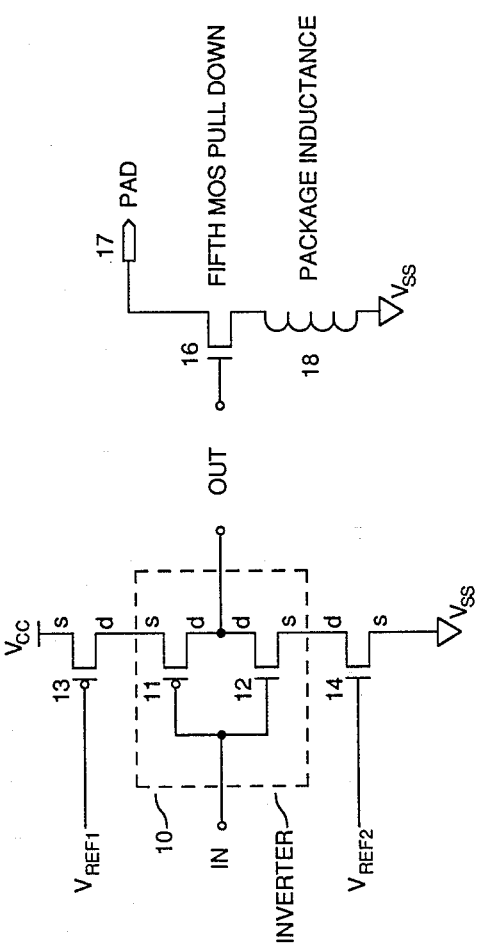
FIG. 2 is a circuit schematic diagram of one embodiment of the invention.

Referring to FIG. 2, the inverter circuit of 10 of the output buffer circuit of the invention includes p-channel enhancement mode MOS transistor 11 and n-channel enhancement mode MOS transistor 12. Coupled between $V_{cc}$ and the source of MOS transistor 11 of the inverter is p-channel enhancement mode transistor 13. Coupled between the source of MOS transistor 12 and ground, or $V_{ss}$, is n-channel enhancement mode MOS transistor 14.

A reference voltage, $V_{REF1}$ is connected to the gate of transistor 13. This reference voltage enables p-channel MOS transistor 13 to act like a constant current source whose source-drain current remains constant irrespective of variations in operating environmental conditions, such as temperature, or in manufacturing process conditions during the manufacturing of the MOS devices on the entire integrated circuit.

By using the reference voltage $V_{REF1}$ to control the current flow into the gate of output transistor 16, that sets the maximum current which can flow from $V_{cc}$ into the gate of transistor 16, which sets the rate at which output transistor 16, connected to the output of inverter 10, turns on. If this current rate of change, di/dt, is decreased, although the turn on of output transistor 16 is slightly delayed, this lower di/dt through transistor 16 reduces output noise.

In accordance with this invention, it is not only necessary to control the rate of change of current flow through transistor 16 during turn on, but also during turn off as well. When transistor 16 is turned off, the current through inductor 18, which is the normal inductance of the integrated circuit package, slows down, and the rate of change of the current flow, di/dt, goes negative. Accordingly, the application of a second reference voltage, $V_{REF2}$, to the gate of n-channel enhancement transistor 14 controls the rate at which the voltage at the gate of output transistor 16 decreases. Voltage $V_{REF2}$ thus sets the maximum current which can flow from the gate of transistor 16 to ground. This slows the turn off rate of transistor 16, bringing the di/dt of the current through inductor 18 closer to 0.

Prior to this invention, no one realized the noise problem during shut off of the output transistor 16. Internal circuit noise during shut off, particularly under extreme temperature conditions, was causing these static RAM circuits to fail, but no one knew the reason why. This problem was exacerbated as the number of output switches in a single integrated circuit increased. For example, dual port RAM circuits have sixteen output switches, as compared to eight for a single port RAM. Therefore, based upon the experience with single port RAMs, it was expected that this type of dual port RAM circuit would fail even more frequently. This invention provided the solution.

Figure 3:
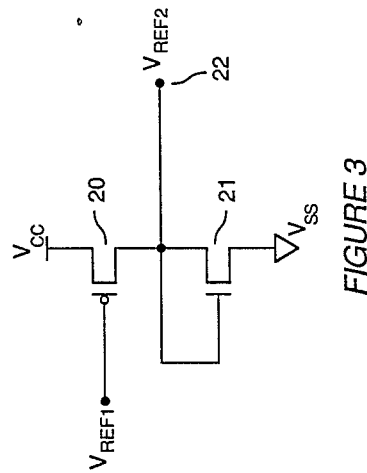
FIG. 3 is a circuit schematic diagram of a current mirror circuit.
Figure 1:
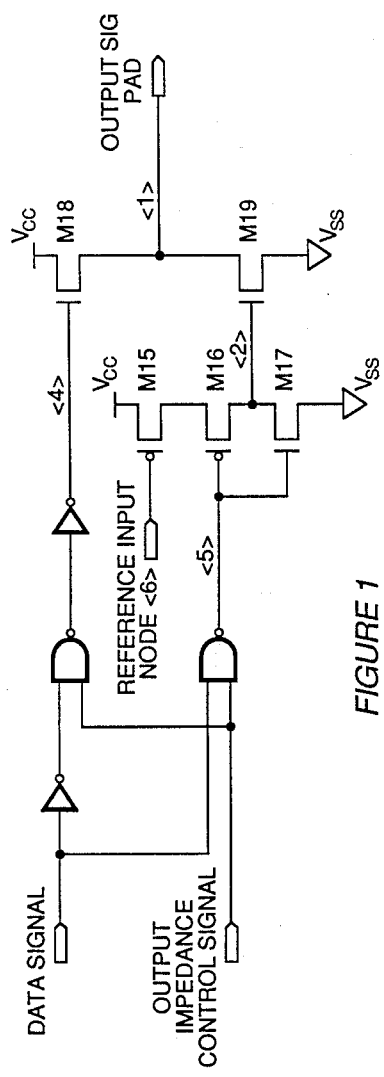
FIG. 1 is a prior art circuit schematic.

One technique of generating $V_{REF2}$ and $V_{REF2}$ is to use the current mirror circuit shown in FIG. 3. This circuit employs two enhancement mode MS transistors, p-channel transistor 20 and n-channel transistor 21. Transistor 20 has its source connected to $V_{cc}$ and its drain connected to the drain of transistor 21. Transistor 21 has its source connected to ground and its gate and drain connected together at node 22, as shown.

In the saturation mode, the gate-to-source voltage on transistor 20 determines the drain current which flows towards the drain of transistor 21. Since no current is drawn externally from the circuit of FIG. 3 (no current flows into or out of node 22), the source-to-drain current through transistor 20 must equal the drain-to-source current through transistor 21. Accordingly, the voltage on node 22 assumes the value necessary for these currents to be equal. The equality of the currents through transistors 20 and 21 is the reason that the circuit in FIG. 3 is called a "current mirror." Accordingly, the voltage on node 22, called $V_{REF2}$, is the mirror of the voltage on the gate of transistor 20, called $V_{REF1}$.

A preferred embodiment of the invention is shown in FIG. 4. The input signals at INPUT and $\overline{INPUT}$ on nodes 32 and 33, respectively, represent the output signals, for example, of a differential sense amplifier. Node 32 is connected to one input of NAND gate 30; Node 33 is connected to one input of NAND gate 31. These NAND gates 30 and 31 are enabled by a signal into output enable terminal 34. The output enable signal acts to turn output transistors 35 and 36 on and off which in turn acts to turn the output of the circuit of FIG. 4 at the pad 47 on and off. The output enable signal is used to put the output into a high impedance state when another chip drives the same signal line on the same printed circuit board. Output enable circuitry is well known in the art.

The circuit of FIG. 4 employs two inverter circuits, 37 and 38. Inverter circuit 37, a typical CMOS inverter circuit, employs p-channel enhancement mode MOS transistor 39 and n-channel enhancement mode MOS transistor 40. Similarly, inverter circuit 38 employs p-channel enhancement mode MOS transistor 41 and n-channel enhancement mode transistor 42. The circuit of the preferred embodiment of the invention of FIG. 4, using two inverters, has the advantage that both inverters may be switched at the same time. Using a single inverter circuit 10, as shown in the embodiment of FIG. 2, requires, if two output transistors are to be used, such as transistors 35 and 36 in FIG. 4, that both of these two output transistors always be switched at the same time. In the embodiment of FIG. 4, unlike the embodiment of FIG. 2, transistor 35 can be switched on at a time when transistor 36 is switched off, and vice-versa. Resistor 60 is a pull-up resistor which couples the source of output transistor 35 to the power supply $V_{cc}$.

P-channel enhancement mode transistor 43, coupled between inverters 37 and 38 and $V_{cc}$ has $V_{REF1}$ coupled to its gate, as shown. $V_{REF1}$ operates in the same manner in the circuit of FIG. 4 as it did in the circuit of FIG. 2. Similarly, $V_{REF2}$ is coupled to the gate of n-channel enhancement mode transistor 44. It too operates in the same manner as it did connected to the gate of transistor 14 in FIG. 2. Alternatively, in another embodiment, node 48 may be disconnected from the drain of transistor 44 and may be instead connected through an additional n-channel transistor (not shown) to ground. This additional n-channel transistor must also have its gate connected to $V_{REF2}$.

N-channel enhancement mode MOS transistors 45 and 46 are high capacitance MOS transistors having their sources and drains coupled to $V_{cc}$, in the case of transistor 45, and to ground in the case of transistor 46. The purpose of these transistors is to provide stability in the event of fluctuations in the ground or $V_{cc}$ voltages. If, for example, the ground (or $V_{ss}$) voltage were to bounce up, transistor 46 capacitively couples the increased ground voltage into the gate node of transistor 44. That gate node therefore goes up in tandem with ground going up. Similarly, if the supply voltage $V_{cc}$ connected to the source and drain of transistor 45 goes down, the gate of transistor 45 will similarly go down, and that reduced gate voltage is coupled directly to the gate of the p-channel transistor 43. Thus, transistors 45 and 46 prevent problems which otherwise might arise from noise bounces on either rail of the power supply. This ensures that the current source devices 43 and 44 in the circuit of FIG. 4 are not inadvertently turned off as a result of voltage spikes on $V_{cc}$ or ground.

Another embodiment of the invention is shown on FIG. 5. The coupling MOS transistors used to couple the inverter circuit to the power supply, for this invention, need to be opposite in either polarity type (n-channel vs. p-channel), or opposite in mode (depletion vs. enhancement). This embodiment of the invention uses all n-channel transistors rather than a CMOS technology, used in the previous embodiments. Moreover, the inverter circuit 49, in this embodiment, uses four MOS transistors rather than two. Transistors 51, 52 and 55 are n-channel enhancement mode transistors, and transistor 54 is an n-channel depletion mode transistor. The gate and source of transistor 54 are connected, as shown, and connected to the gate of transistor 51. The gate of transistor 55 is connected to the gate of transistor 52. This type of n-channel inverter is well known in the art.

Coupling transistor 50, which couples inverter 49 to the positive power supply terminal $V_{cc}$ is an n-channel depletion mode transistor. Coupling transistor 53, which couples inverter 49 to the negative supply terminal, is an n-channel enhancement transistor. $V_{REF1}$ and $V_{REF2}$ are connected to the gates of their respective coupling transistors as in previous embodiments, and operate in exactly the same manner to control the voltage and current at the output node 56 (which is usually connected to an output transistor not shown, as before). This circuit operates the same as the CMOS embodiments described before.

It should be understood that the embodiments of the invention illustrated in the above drawings represent preferred embodiments and examples, and many changes can be made in the implementation of the circuits described above without departing from the spirit and scope of the invention, which is defined by the claims which follow.

I claim:

1. An output buffer circuit capable of switching from the off state to the on state, and from the on state to the off state, without generating significant noise, comprising:

an MOS inverter circuit having a first node for connection to one terminal of a power supply and a second node for connection to the other power supply node, and having an input means for receiving an input signal and an output means for providing an output signal to an output transistor;

a first MOS transistor of one polarity type and of either enhancement or depletion mode, having its source-drain circuit coupled in series with said first node of said MOS inverter circuit;

a second MOS transistor of the opposite polarity type or mode from said first MOS transistor, having its source-drain circuit coupled in series with the said other node of said MOS inverter circuit;

a means for supplying a first reference voltage to the gate of said first MOS transistor and for supplying a second reference voltage which is the mirror of said first reference voltage to the gate of said second MOS transistor, said reference voltages enabling said first and second MOS transistors to act like constant current sources which generate stable currents over normal variations in operating and processing conditions of the MOS transistors in the circuit, whereby the rise and fall times of said output signal from said inverter circuit are precisely controlled irrespective of normal changes in operating or processing conditions of the MOS transistors in the circuit, thereby reducing the noise when said output transistor connected to said output means is turned on or off.

2. An output buffer circuit capable of switching from the off state to the on state, and from the on state to the off state, without generating significant noise, comprising:

an MOS inverter circuit having two MOS transistors, a first P-channel transistor and a second N-channel transistor, the source of the P-channel transistor being for connection to the positive terminal of a power supply and the source of the N-channel transistor being for connection to the other terminal of said power supply, and having an input means coupled to the gates of said two MOS transistors and an output means coupled to the drain terminals of said first and second MOS transistors, said output means being for connection to an output transistor;

a third MOS transistor of one polarity type and one mode having its source-drain circuit coupled in series between the source of said first P-channel MOS transistor of said inverter circuit and said positive terminal of said power supply;

a fourth MOS transistor opposite in either polarity type or mode from said first transistor, having its source-drain circuit coupled in series between the source of said second MOS transistor of said inverter circuit and said other terminal of said power supply;

a means for supplying a first reference voltage to the gate of said third MOS transistor and for supplying a second reference voltage which is the mirror of said first reference voltage to the gate of said fourth MOS transistor, said reference voltages enabling said first and second MOS transistors to act like constant current sources which generate stable currents over normal variations in operating and processing conditions, whereby the rise and fall times of said output signal from said inverter are precisely controlled irrespective of normal changes in operating or processing conditions, thereby reducing noise when said output transistor connected to said output means is turned on or off.

3. The output buffer circuit of claim 2 further characterized by said means for supplying said second reference voltage including a current mirror circuit having as its input voltage said first reference voltage.

4. The output buffer circuit of claim 2 further characterized by said inverter being a CMOS circuit, said first MOS transistor being of one polarity type and said second MOS transistor being of the opposite polarity type.

5. The output buffer circuit of claim 4 further characterized by said third MOS transistor being of the same polarity type as said first MOS transistor and said fourth MOS transistor being of the same polarity type as said second MOS transistor.

6. The output buffer circuit of claim 1 further characterized by said output means of said inverter circuit being coupled to the gate of a fifth MOS pull down transistor, one of the source or drain of said fifth MOS transistor providing the output signal from said buffer circuit and the other of said source or drain terminals of said fifth MOS being coupled to a point of fixed potential.

* * * * *

REEXAMINATION CERTIFICATE (1824th)

United States Patent [19]
Platt

[11] B1 4,877,978
[45] Certificate Issued  Oct. 27, 1992

[54] OUTPUT BUFFER TRI-STATE NOISE REDUCTION CIRCUIT

[75] Inventor: Paul E. Platt, Starkville, Miss.

[73] Assignee: Cypress Semiconductor Corporation, San Jose, Calif.

Reexamination Request:
No. 90/002,575, Feb. 10, 1992

Reexamination Certificate for:
Patent No.: 4,877,978
Issued: Oct. 31, 1989
Appl. No.: 246,634
Filed: Sep. 19, 1988

[51] Int. Cl.[5] ............... H03K 19/017; H03K 19/003; H03K 17/16
[52] U.S. Cl. .................. 307/473; 307/452; 307/555; 307/568; 307/585; 307/443; 307/451
[58] Field of Search ............ 307/473, 452, 542, 544, 307/443, 263, 576, 451, 443

[56] References Cited

U.S. PATENT DOCUMENTS 4,782,252  11/1988  Levy et al. .................. 307/576

Primary Examiner—John S. Heyman

[57] ABSTRACT

The invention pertains to an output buffer circuit capable of switching from the off state to the on state, and from the on state to the off state, without generating significant noise. The circuit includes an MOS inverter circuit having a first node adapted to be connected to one terminal of a power supply and a second node adapted to be connected to the other node, and having an input for receiving an input signal and an output for providing an output signal adapted to be connected to an output transistor. The circuit also has a first MOS transistor of one polarity type and one mode having its source-drain circuit coupled in series with the first node of the inverter circuit, and a second MOS transistor opposite in either polarity type or mode from the first MOS transistor, having its source-drain circuit coupled in series with the other node of the inverter circuit. A first reference voltage is supplied to the gate of the first MOS transistor and a second mirrored reference voltage is supplied to the gate of the second MOS transistor. These reference voltages are capable of generating a stable current over normal variations in operating and processing conditions, whereby the rise and fall times of the output signal from the inverter circuit are precisely controlled, irrespective of normal changes in operating or processing conditions of the MOS transistor in the circuit, thereby reducing noise when the output transistor connected to the output is turned on or off.

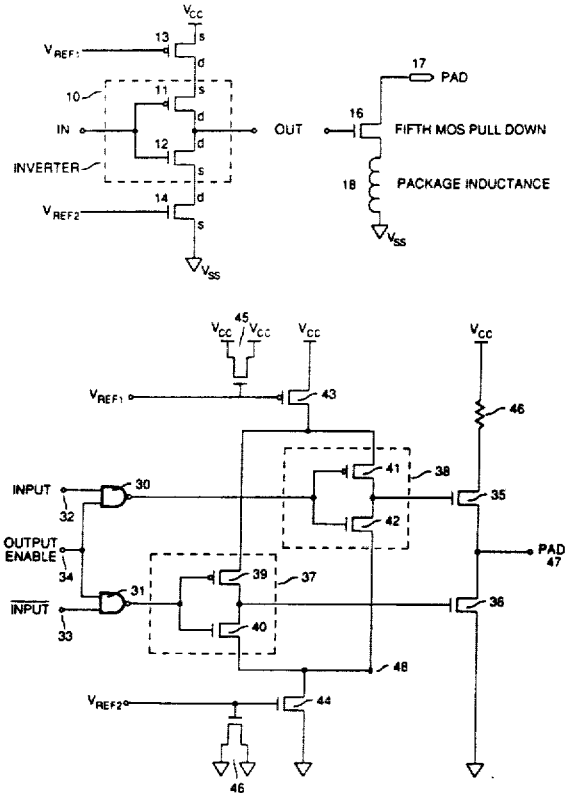

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is cancelled.

Claims 2 and 6 are determined to be patentable as amended.

Claims 3-5 dependent on an amended claim, are determined to be patentable.

2. An output buffer circuit capable of switching from the off state to the on state, and from the on state to the off state, without generating significant noise, comprising:

an MOS inverter circuit having two MOS transistors, a first P-channel transistor and a second N-channel transistor, the source of the P-channel transistor being for connection to the positive terminal of a power supply and the source of the N-channel transistor being for connection to the other terminal of said power supply, and having an input means coupled to the gates of said two MOS transistors and an output [means] *node* coupled to the drain terminals of said first and second MOS transistors *and to an output transistor* said output *node providing an output signal* [means being for connection to an] *to said* output transistor *and wherein the source-drain circuit of said first MOS transistor is coupled in series with the source-drain circuit of said second MOS transistor;* a third MOS transistor of one polarity type and one mode having its source-drain circuit coupled in series between the source of said first P-channel MOS transistor of said inverter circuit and said positive terminal of said power supply;

a fourth MOS transistor opposite in either polarity type or mode from said [first] *third* transistor, having its source-drain circuit coupled in series between the source of said second MOS transistor of said inverter circuit and said other terminal of said power supply;

*an enable means for placing said output buffer in a high impedance off state, said enable means being coupled to said MOS inverter circuit;* a means for supplying a first reference voltage to the gate of said third MOS transistor and for supplying a second reference voltage which is the mirror of said first reference voltage to the gate of said fourth MOS transistor, said reference voltages enabling said [first and second] *third and fourth* MOS transistors to act like constant current sources which generate stable currents over normal variations in operating and processing conditions, *said reference voltages enabling said third and fourth MOS transistors to control irrespective of normal operating or processing conditions of the MOS transistors in the circuit and rise and fall times of said output signal from said inverter circuit wherein said output signal controls the rate of change of current flow through said output transistor when said output transistor turns on or when said output transistor turns off by operation of said enable means,* [whereby the rise and fall times of said output signal from said inverter are precisely controlled irrespective of normal changes in operating or processing conditions], thereby reducing noise when said output transistor connected to said output [means] *node* is turned on or off.

6. The output buffer circuit of claim [1] *2* further characterized by said output [means] *node* of said inverter circuit being coupled to the gate of a fifth MOS pull down transistor, one of the source or drain of said fifth MOS transistor providing the output signal from said buffer circuit and the other of said source or drain terminals of said fifth MOS being coupled to a point of fixed potential.

* * * * *